United States Patent [19]

Oister

[11] 3,978,838

[45] Sept. 7, 1976

[54] D-C POWER SUPPLY AND IGNITION SYSTEM

[76] Inventor: George K. Oister, 1109 SE. 11 St., Edmond, Okla. 73034

[22] Filed: Feb. 14, 1974

[21] Appl. No.: 442,497

[52] U.S. Cl. .......................... 123/148 CA; 315/411; 123/148 CB; 307/247 A

[51] Int. Cl.[2] ...................... F02P 1/00; H03K 17/60

[58] Field of Search... 123/14B CA, 148 E, 148 CB; 315/411

[56] References Cited

UNITED STATES PATENTS

| | | | |
|---|---|---|---|
| 3,169,212 | 2/1965 | Walters | 123/148 E |
| 3,581,726 | 6/1971 | Plume | 123/148 E |
| 3,599,616 | 8/1971 | Oishi | 123/148 E |
| 3,626,200 | 12/1971 | Sasayama | 123/148 ICD |
| 3,736,963 | 5/1973 | Basso | 123/148 E |

*Primary Examiner*—Charles J. Myhre
*Assistant Examiner*—Ronald B. Cox
*Attorney, Agent, or Firm*—Robert M. Hessin

[57] ABSTRACT

A device for generating high voltages from a relatively low voltage primary power source and finding particular usage in automobile engine ignition, television high voltage supply and the like, the device consisting of a periodically energized one-shot multivibrator which provides trigger output to a turn-on transistor network as connected in series with an inductor and diode to the primary power source. A charging capacitor periodically energized from the inductor then provides output energy to the engine ignition transformer or other auto-induction high voltage device. Specific circuitry of the device when used for engine ignition provides for anti-preignition, anti-point bounce and an alternator light by-pass circuit.

2 Claims, 2 Drawing Figures

D-C POWER SUPPLY AND IGNITION SYSTEM

BACKGROUND OF THE INVENTION

1. Field of the Invention

The invention relates generally to D-C power supplies and, more particularly, but not by way of limitation, it relates to an improved D-C high voltage generation device for gasoline engine spark ignition.

2. Description of the Prior Art

Capacitive discharge ignition systems of general type have been known in the art for some years and particular prior art providing such teachings are U.S. Pat. No. 3,308,801 in the name of Motto and U.S. Pat. No. 3,372,681 to Phillips et al. Such prior art devices were similar in many respects as to the mode utilized in charging and discharging a capacitor to induce high output voltage for conduction to an engine ignition coil. However, such prior art capacitive discharge ignition systems had attendant disadvantages, particularly that of dissipating excessive electrical power in the process of generating the periodic high voltage bursts, and the attendant or consequent disadvantage of burnout of ignition wire, circuit components and the like.

SUMMARY OF THE INVENTION

The present invention contemplates an improved high voltage power supply of the type which is energized by a low voltage D-C primary power source to generate or convert to a relatively much higher voltage output. In a more limited aspect, the invention consists of an input triggering circuit which provides output trigger pulses of predetermined duration for periodic energization of an inductance/capacitance charging circuit which provides output of increased voltage to a utilizing load circuit.

Therefore, it is an object of the present invention to provide an improved engine spark ignition circuit which functions with much lower average power dissipation and provides a high voltage output which does not vary with revolution rate of the engine.

It is also an object of the invention to provide a capacitive discharge engine spark ignition circuit which includes protective circuitry guarding against pre-ignition of start, point bounce ignitions and spurious ignitions due to alternator alarm light shunt.

It is yet another object of the present invention to provide an engine spark ignition circuit wherein the high voltage output has a faster rise time and functions to reduce misfires, maintain clean spark plugs and allow optimum timing setting as the critical gap set detriments are avoided.

Finally, it is an object of the present invention to provide a D-C voltage converter circuit which is reliable and economical of construction yet which with slight variation can be employed for diverse high voltage generation uses including automobile engine ignition, television high voltage supply, and the like.

Other objects and advantages of the invention will be evident from the following detailed description when read in conjunction with the accompanying drawing which illustrates the invention.

DETAILED DESCRIPTION OF THE INVENTION

Figure 1:
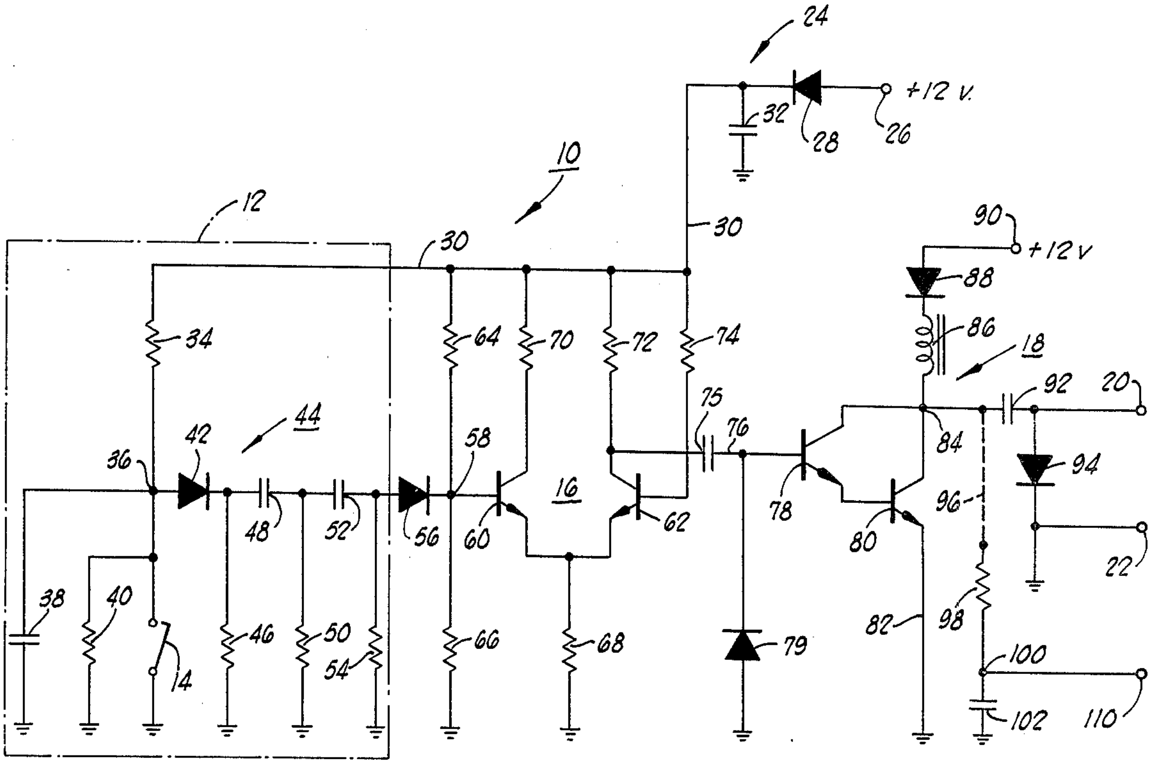
FIG. 1 is a schematic diagram of a high voltage generation circuit constructed in accordance with the present invention.

FIG. 1 represents a high voltage circuit 10 which may be specifically utilized for reciprocal engine spark ignition. The circuit 10 consists of a timing circuit 12, including contactor points 14, a trigger circuit 16 and discharge circuit 18 which provides high voltage output between terminals 20 and ground terminal 22 for connection to a conventional type of auto ignition transformer or the like. An ignition circuit 24 enables the start function as +12 volt battery supply is applied at terminal 26 through a diode 28 for application on power lead 30 to energize the circuit 10. A capacitor 32 connected between input lead 30 and ground provides an anti-preignition function, as will be further described below.

The power lead 30 is connected to anti-point bounce circuit 12 through a voltage dropping resistor 34 to a junction 36 in series with contact points 14 (distributor points) to ground. Junction 36 is also connected through a capacitor 38 to ground and through a resistor 40 to ground, resistor 40 being of a value which provides effective shunting of the alternator alarm light. Finally, voltage applied at junction 36 is present through a diode 42 to a resistor/capacitor network 44 consisting of grounded resistor 46, series capacitor 48, grounded resistor 50, series capacitor 52 and grounded resistor 54. As will be further described below, the resistors 46 and 50 in capacitor 48 serve to regulate the circuit time constant while capacitor 52 and resistor 54 differentiate voltage for input through a diode 56 to an input junction 58 to trigger circuit 16.

The trigger circuit 16 consists of a one-shot multivibrator comprised of parallel, common-emitter connected NPN transistors 60 an 62. The input junction 58 is disposed in a voltage divider network consisting of resistors 64 and 66 as connected in series between power lead 30 and ground. Input junction 58 is connected to the base of transistor 60 while the transistor common emitters are connected through a resistor 68 to ground. The collector of transistor 60 is connected through a load resistor 70 to power lead 30 while the collector of transistor 62 is connected through a load resistor 72 to power lead 30 and output is taken directly from the collector of transistor 62. The base of transistor 62 is maintained at selected bias by a resistor 74.

The trigger circuit 16 has also been constructed utilizing a Signetics Type 541212 Monostable Multivibrator integrated circuit. Inclusion of this circuit enables still greater control of point bounce effects since the R/C time constants of the integrated circuit can be adjusted to blank out point cycle durations when point bounce may occur.

One-shot trigger output from trigger circuit 16 is present via capacitor 75 on lead 76 for input to the discharge circuit 18, i.e., the base of an NPN transistor 78. The emitter of transistor 78 is connected for input to the base of an NPN transistor 80 which is connected common-emmitter via ground lead 82. The collectors of transistors 78 and 80 are connected in parallel to a junction 84 which is further connected to a large reactance coil 86 in series with a diode 88 and the primary power source or +12 volt D-C battery supply at terminal 90. The junction 84 is further connected through a charging capacitor 92 to high voltage output terminal 20 while a diode 94 is connected between output terminal 20 and ground terminal 22. In practice, for example, the circuit may utilize an iron core, saturable inductance 86 on the order of three millihenries and rated at 8 amperes with charging capacitor 92 having a value of 2 microfarads and rated at 400 volts. These values can, of course, be varied in accordance with the exigencies of the particular circuit application.

The additional circuitry, tied in by dash-lines 96, resistor 98, junction 100 and series-connected capacitor 102 to ground, will be further discussed below in relation to the circuitry of FIG. 2.

In operation, the high voltage circuit 10 serves to provide an optimum performance when used for engine ignition spark control. Circuit 10 may be employed with the new or older cars, whether or not they employ resistance wire or ballast resistors, since the circuit 10 draws current directly from the battery at terminal 90. The trigger circuit 16 or one-shot multivibrator draws its current from the ignition switch via terminal 26 through resistance wire and, since the current for the one-shot multivibrator or trigger circuit 16 is approximately 100 milliamps, the drop through the resistance wire will be on the order of 0.2 volts d-c. Thus, the power dissipation is only 0.6 watts whereas for any other capacitory-discharge ignition system, the dissipation may be on the order of 30 watts. These figures are further contrasted with the conventional ignition system which dissipates power on the order of 18 watts and has the further disadvantage of causing burnout of ignition wires.

Upon initial start-up of the engine, +12 volts d-c is applied at terminal 26 to the anti-preignition circuit 24. The capacitor 32 provides the function of a non-linear filter and avoids any initial voltage drop on power lead 30 for energization of the trigger circuit 16 and anti-point bounce circuit 12. During start up, the battery voltage may drop to approximately 8 volts and thereafter alternate between 8 and 10 volts d-c as the engine turns over. This pulsating voltage can act as a signal to conventional input circuits causing pre-ignition and/or hard starting during start up. This defeats the very purpose of a capacitor-discharge ignition system and, therefore, the capacitor 32 and diode 28 are employed to provide a constant voltage for energization of the one-shot multivibrator transistors 60 and 62 thereby to eliminate any possibility of false trigger.

The constant value d-c primary voltage is then available on power lead 30 to junction point 36 where the periodic actuation of distributor points 14 develops a trigger pulse input through the resistor/capacitor network 44 for triggering of trigger circuit 16. The network 44 includes resistor 46, capacitor 48 and resistor 50 which function as a long time constant circuit, the R-C time constant of which should be at least ½ the revolution period for the highest rpm rating of the particular engiine. Capacitor 52 and resistor 54 then provide a differentiating network for shaping a triggering pulse for input to trigger circuit 16.

As the distributor points 14 open, the voltage at the points 14 rises to the battery voltage thereby causing the diode 42 to conduct. The capacitor 48 then begins to charge, and the voltage across resistor 54 is the differentiated voltage which appears across resistor 50. The differentiated voltage that is developed across resistor 54 is the voltage which is set by the time constant of capacitor 52 and resistor 54. Thereafter, the points 14 close and the voltage at the diode 42 will go to zero whereupon capacitor 48 discharges causing a negative voltage to appear at resistor 50. A negative going differentiated signal then appears at resistor 54 which is blocked by the diode 56. If the points 14 should open immediately after closing, as would be caused by point bounce, the voltage across capacitor 48 will not have discharged sufficiently to cause a signal to be coupled to resistor 50. This causes the circuit to ignore the point bounce, primarily due to the fact that the time constant of capacitor 48, resistor 46 and resistor 50 are selected to be longer than any point bounce duration. Thus, capacitor 48 discharges to a nominal value before the points open at their proper time, and is thereafter ready to pass the signal when the points do open at the proper timing point.

Thus, only upon opening of distributor points 14 will a differentiated signal be applied as input to the base of transistor 60 to trigger the one-shot multivibrator. Such activation of trigger circuit 16 provides a single positive going pulse of constant time duration, on the order of 2.5 milliseconds, for all rpm rates of the engine, thus enabling a constant voltage versus rpm characteristic.

In discharge circuit 18, the voltage forming network consists of diode 88, coil 86 and transistor 80. A switching of current in the coil 86 to zero value will not cause the voltage generated to be equal to $L(di/dt)$ but, instead, the voltage will be equal to $I\sqrt{L/C}$. Thus, as long as the switching time is at least 0.1 of the time constant of the R-L-C circuit, the voltage output will follow the relationship $I\sqrt{L/C}$ and not the differential value. The output trigger from the trigger circuit 16, having a fixed time duration, will then allow the same amount of current to flow each time in coil 86 no matter what the engine rpm rate.

High voltage and high energy are developed by storing energy in coil 86 and thereafter transferring the energy of coil 86 to charging capacitor 92. Thus, upon occurrence of trigger input on lead 76, the transistors 78 and 80 are rendered conductive and serve effectively to ground junction point 84 such that charging capacitor 92 begins to discharge. During such discharge the voltage across capacitor 92 is applied across the external coil, i.e. output terminals 20 and 22. This enables an extremely fast voltage rise time across the external coil terminals 20 and 22.

The transistors 78 and 80 will continue to conduct until the trigger pulse voltage is removed on input lead 76. Upon cessation of the trigger, the stored energy in coil 86 is again transferred for charging of capacitor 92 and the system is ready for the next firing cycle as will occur upon opening of distributor points 14.

Figure 2:
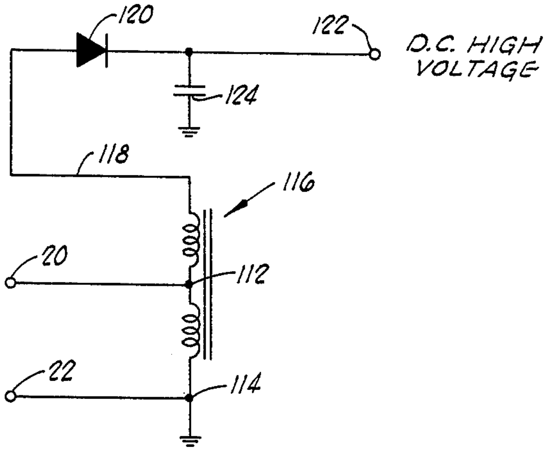
FIG. 2 is a schematic diagram of auxiliary circuitry which may be interconnected with the circuitry of FIG. 1 to perform additional high voltage generation functions.

Referring now to FIGS. 1 and 2 in combination, addition of the FIG. 2 circuitry will enable the circuit 10 to be employed as a high voltage power supply and horizontal sweep output circuit for a conventional form of television receiver. Thus, and referring to FIG. 1, if wire connector 96 (dashed lines) is inserted via a resistor 98 through junction point 100 and a capacitor 102 to ground, a terminal point 110 becomes the output terminal for horizontal sweep output to control horizontal deflection on the cathode ray screen. Horizontal output wave shaping is decided by selection of the time constant of resistor 98 and capacitor 102, and repetition rate is determined by trigger input through diode 56 to junction point 48 and the one-shot multivibrator or trigger circuit 16. The anti-point bounce circuit 12 will, of course, be deleted for television use.

The circuitry of FIG. 2 would also be connected with terminals 20 and 22 connected to junction points 112 and 114, respectively, of a television auto transformer 116 of conventional type. Transformer 116 is connected between ground and a lead 118 which conducts through a diode 120 to high voltage output terminal 122 which may then be connected to provide cathode ray tube high voltage. A storage capacitor 124 of large value is connected between high voltage output terminal 122 and ground in conventional manner.

The foregoing discloses a high voltage D-C power supply having particularly desirable characteristics as to high energy and high voltage while still achieving desirable attributes as to constant output despite input triggering frequency variations. When used in auto ignition systems, the circuit has the advantages of reducing misfires, cleaning plugs, allowing better timing setting and avoiding detriments as to variations in spark plug gap. In addition, the circuitry includes various protective circuits for guarding against problems of point bounce, reduced battery voltage upon starting, alternator alarm light shunt and various triggering problems which heretofore have prevented capacitor discharge ignition systems from reaching full potential and capabilities in actual usage.

It is also contemplated that the present ignition system will serve equally as well when utilized with the more recently developed automotive engine magnetic point systems. In this event, the anti-point bounce circuitry 12 may be removed with input from the magnetic firing actuators applied directly through diode 56 for input to triggering circuit 16. Also, with but little variation, the circuit has proven to provide a very reliable and highly economical D-C high voltage supply for television receivers. Here again, the system has the capability of constant high voltage output with sufficient power despite variation in the repetition rate of the input triggering voltage.

Changes may be made in the combination and arrangement of elements as heretofore set forth in the specification and shown in the drawing; it being understood that changes may be made in the embodiments disclosed without departing from the spirit and scope of the invention as defined in the following claims.

What is claimed is:

1. An engine ignition circuit for generating periodic high voltage from a low voltage D-C power source, comprising:

an input junction connected through a non-linear filter means to said low voltage D-C power source;

contactor point switch means connected between said junction and ground to provide periodic ground disconnection of said low voltage D-C power source;

a resistance-capacitance network connected to said junction and having a network output, said network consisting of a first capacitor coupled between said input junction and a second junction, a resistor connected between said second junction and ground, a second capacitor connected between said second junction and a network output, and a second resistor connected between said network output and ground, said network serving to prevent generation of a trigger pulse except upon initial opening of said contactor points switch means and for a pre-set time duration thereafter;

one-shot vibrator means connected to said network output and periodically energized by trigger output therefrom to provide an output pulse of pre-set duration;

coil means energized by said low voltage power source and connected in series with a transistor means, said transistor means being normally nonconducting and rendered conductive in response to input of said output pulse from said one-shot multivibrator; and charging capacitor means having one side connected between said coil means and said transistor means and having its other side connected to an output high voltage terminal whereupon D-C high voltage is present each time said transistor means is rendered conductive.

2. A circuit as set forth in claim 1 which is further characterized to include:

resistance means connected between said input junction and ground to compensate for shunt effects of ancillary circuits connected to said low voltage D-C power source.

* * * * *